United States Patent
Huang

(10) Patent No.: US 9,437,471 B2
(45) Date of Patent: Sep. 6, 2016

(54) SHALLOW TRENCH ISOLATIONS AND METHOD OF MANUFACTURING THE SAME

(71) Applicant: UNITED MICROELECTRONICS CORP., Hsin-Chu (TW)

(72) Inventor: Liang-An Huang, Tainan (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 0 days.

(21) Appl. No.: 14/572,788

(22) Filed: Dec. 17, 2014

(65) Prior Publication Data

US 2016/0181146 A1 Jun. 23, 2016

(51) Int. Cl.
*H01L 21/762* (2006.01)
*H01L 29/06* (2006.01)

(52) U.S. Cl.
CPC ..... *H01L 21/76229* (2013.01); *H01L 29/0653* (2013.01)

(58) Field of Classification Search
None
See application file for complete search history.

(56) References Cited

U.S. PATENT DOCUMENTS

| 6,274,457 B1 * | 8/2001 | Sakai | H01L 21/76232 257/506 |
| 6,586,314 B1 | 7/2003 | Siah | |
| 2002/0048897 A1 * | 4/2002 | Hong | H01L 21/76232 438/424 |
| 2007/0252731 A1 * | 11/2007 | Chung | H01L 21/761 341/50 |
| 2011/0248341 A1 * | 10/2011 | Ring | H01L 29/0653 257/335 |

* cited by examiner

*Primary Examiner* — Asok K Sarkar
(74) *Attorney, Agent, or Firm* — Winston Hsu; Scott Margo

(57) ABSTRACT

A method of manufacturing shallow trench isolations is provided in the present invention, which includes the steps of providing a substrate, performing a zero etch to form preliminary trenches in the substrate, performing a STI etch to the preliminary trenches to form final trenches, where the final trenches are deeper and steeper than the preliminary trenches, and filling up the final trenches with insulating material to form shallow trench isolations.

6 Claims, 4 Drawing Sheets

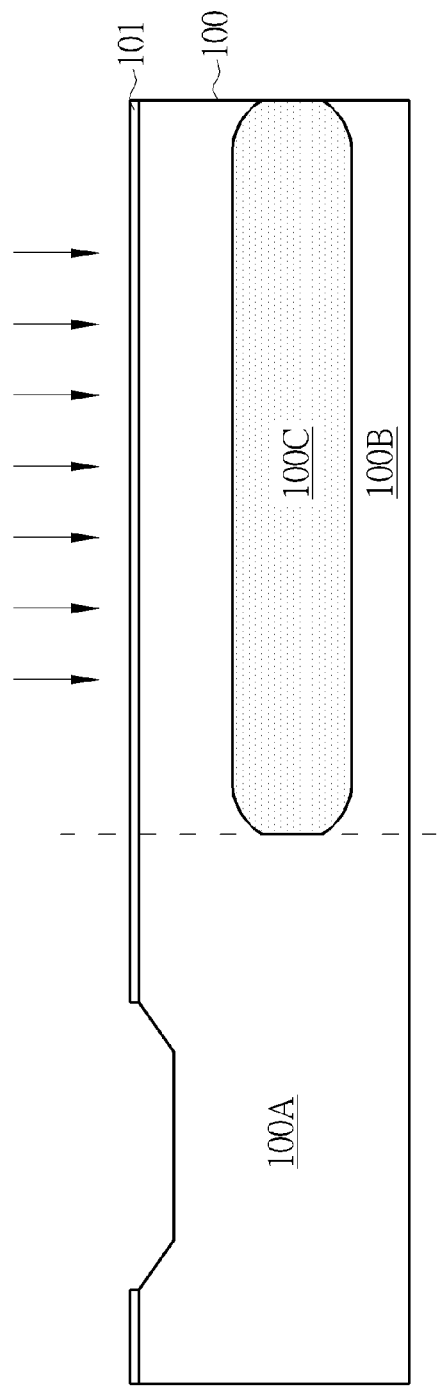
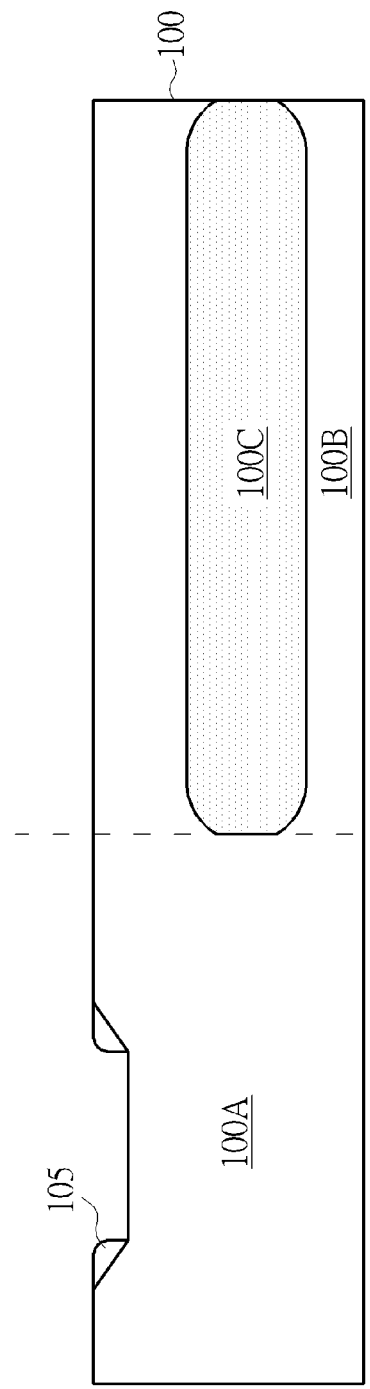

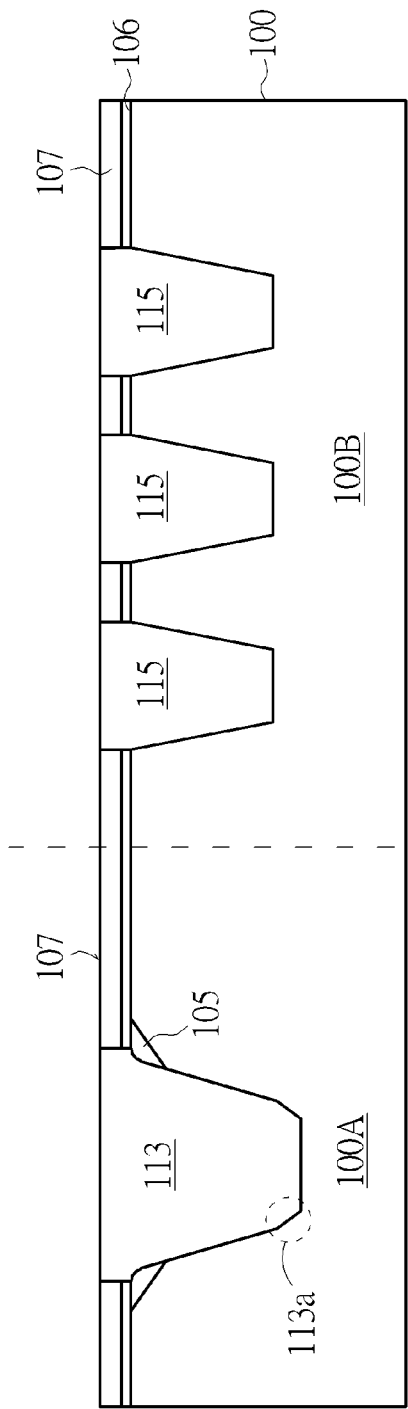
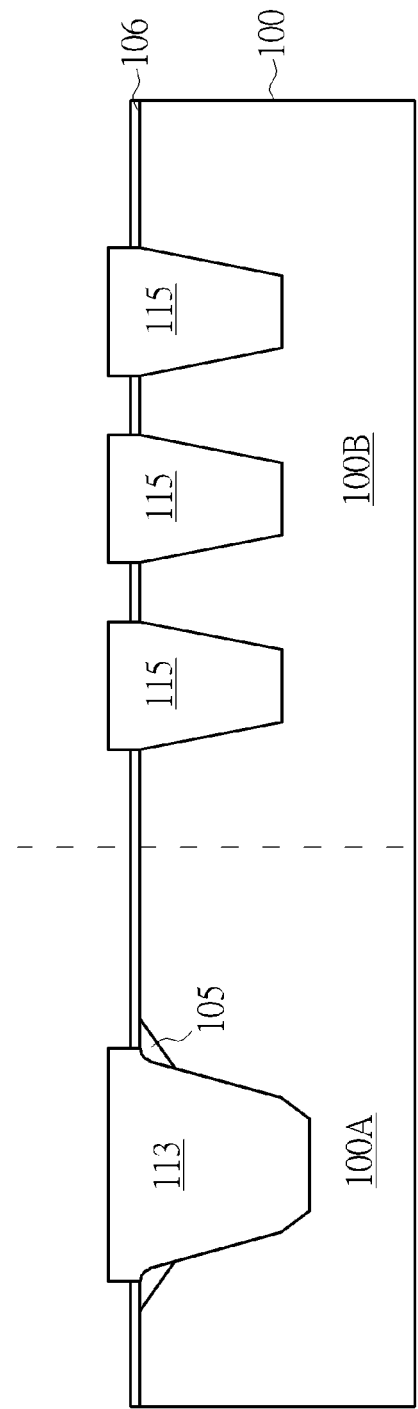
FIG. 7
FIG. 8

SHALLOW TRENCH ISOLATIONS AND METHOD OF MANUFACTURING THE SAME

BACKGROUND OF THE INVENTION

1. Field of the Invention

The present invention generally relates to a shallow trench isolation (STI) and method of manufacturing the same, and more particularly, to a shallow trench isolation with gradual sidewalls and method of manufacturing the same.

2. Description of the Prior Art

The advent of micro-miniaturization, or the ability to fabricate semiconductor devices with sub-micron features, has resulted in the migration from LOCOS, (local oxidation of silicon), isolation technology to an STI isolation technology. Narrow active device regions, comprising sub-micron features become difficult to maintain when isolation regions are formed via LOCOS technology. Bird beak formation, or encroachment of the silicon dioxide isolation region obtained via thermal oxidation procedures, into the adjacent silicon regions result in undesirable consumption of the designed active device region. The use of STI allows the design dimensions of the active device region to be maintained due to the absence of a thermal oxidation procedure used to grow a thick silicon dioxide isolation region. The STI regions are formed via definition of shallow trench shapes in a top portion of a semiconductor substrate, followed by insulator filling and planarization procedures.

The STI technology while not consuming adjacent silicon of an active device region, however, presents other unwanted phenomena, again at the isolation region-semiconductor interface. The dry etch procedures used to define the shallow trench shapes in a top portion of the semiconductor substrate create a sharp corner in the active device region at the STI-semiconductor interface. The sharp corner can result in an unwanted high electric field region for the active device region, translating to deleterious device parameters such as sub-threshold leakage. This phenomenon would become more critical in the 90 nm Bipolar-CMOS-DMOS (BCD) device, wherein the STI structure would be shallower and steeper with an even sharper corner profile.

SUMMARY OF THE INVENTION

This invention will describe a novel process sequence for fabrication of STI regions, in which corner rounding of adjacent active device regions is reduced. This is accomplished via use of a combination of an initial zero mark to form a preliminary trench and a normal STI etch to form a final trench.

One objective of the present invention is to provide a method of manufacturing shallow trench isolations, which includes the steps of providing a substrate, performing a zero etch to form alignment marks and preliminary trenches in the substrate, performing a STI etch to the preliminary trenches to form final trenches, wherein the final trenches are deeper and steeper than the preliminary trenches, and filling up the final trenches with insulating material to form shallow trench isolations.

In an alternative aspect, the method of the present invention further includes the step of forming a spacer on the sidewall of each preliminary trench before the STI etch for the profile of the spacer to be transferred to the final trench.

Another objective of the present invention is to provide a shallow trench isolation in a substrate, which includes a substrate, and a shallow trench isolation formed in the substrate, wherein the sidewall of the shallow trench isolation has two different slopes.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings:

FIGS. 1-8 are cross-sectional views depicting an exemplary process flow of manufacturing shallow trench isolations in accordance with the embodiment of the present invention.

Figure 1:
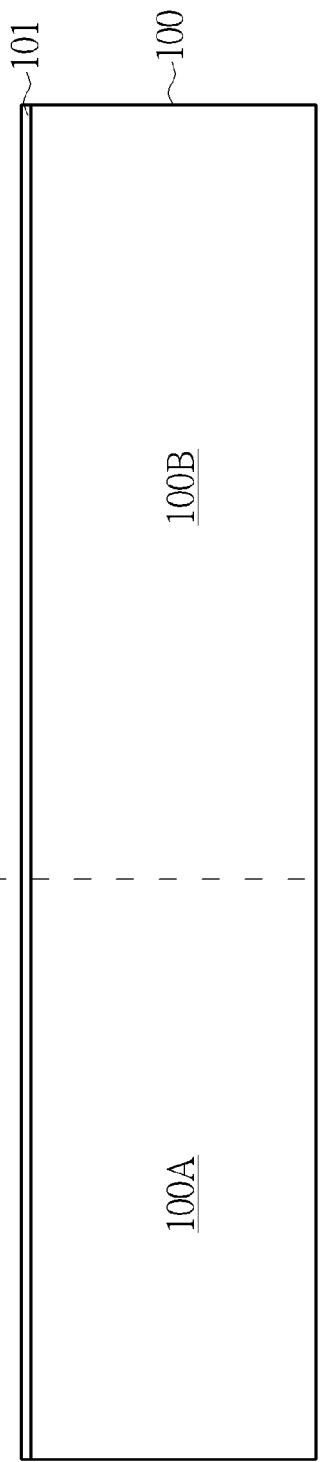

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the present invention, reference is made to the accompanying drawings which form a part hereof and is shown byway of illustration and specific embodiments in which the invention may be practiced. These embodiments are described in sufficient details to enable those skilled in the art to practice the invention. Other embodiments may be utilized and structural, logical, and electrical changes may be made without departing from the scope of the present invention. The following detailed description, therefore, is not to be taken in a limiting sense, and the scope of the present invention is defined by the appended claims.

Before describing the preferred embodiment in more detail, further explanation shall be given regarding certain terms that may be used throughout the descriptions.

The term "etch" or "etching" is used herein to generally describe a fabrication process of patterning a material, such that at least a portion of the material remains after the etch is completed. For example, it should be understood that the process of etching silicon involves the steps of patterning a masking layer (e.g., photoresist or a hard mask) above the silicon, and then removing the areas of silicon no longer protected by the masking layer. As such, the areas of silicon protected by the mask would remain behind after the etch process is complete. However, in another example, etching may also refer to a process that does not use a mask, but still leaves behind at least a portion of the material after the etch process is complete. The above description serves to distinguish the term "etching" from "removing." When etching a material, at least a portion of the material remains behind after the process is completed. In contrast, when removing a material, substantially all of the material is removed in the process. However, in some embodiments, 'removing' is considered to be a broad term that may incorporate etching.

During the descriptions herein, various regions of the substrate upon which the field-effect devices are fabricated are mentioned. It should be understood that these regions may exist anywhere on the substrate and furthermore that the regions may not be mutually exclusive. That is, in some embodiments, portions of one or more regions may overlap. Although up to three different regions are described herein, it should be understood that any number of regions may exist on the substrate and may designate areas having certain types of devices or materials. In general, the regions are used to conveniently describe areas of the substrate that include similar devices and should not limit the scope or spirit of the described embodiments.

The terms "forming," "form," "deposit," or "dispose" are used herein to describe the act of applying a layer of material to the substrate. Such terms are meant to describe any possible layer-forming technique including, but not limited to, thermal growth, sputtering, evaporation, chemical vapor deposition, epitaxial growth, electroplating, etc. According to various embodiments, for instance, deposition may be performed according to any appropriate well-known method. For instance, deposition can comprise any process that grows, coats, or transfers material onto a substrate. Some well-known technologies include physical vapor deposition (PVD), chemical vapor deposition (CVD), electrochemical deposition (ECD), molecular beam epitaxy (MBE), atomic layer deposition (ALD), high density plasma CVD (HDPCVD) and plasma-enhanced CVD (PECVD), amongst others.

The "substrate" as used throughout the descriptions is most commonly thought to be silicon. However, the substrate may also be any of a wide array of semiconductor materials such as germanium, gallium arsenide, indium phosphide, etc. In other embodiments, the substrate may be electrically non-conductive such as a glass or sapphire wafer.

FIGS. 1-8 are cross-sectional views depicting an exemplary process flow of manufacturing shallow trench isolations in accordance with the embodiment of the present invention. First, please refer to FIG. 1. A semiconductor substrate 100 is provided to serve as base for forming the shallow trench isolations of the present invention. The substrate 100 is commonly divided into a high-voltage (HV) region 100A and a logic region 100B. The HV region 100A is defined to form high voltage control logic (such as 36V high-voltage double diffused metal-oxide devices (DMOS)) and the logic region 100B is defined to form low voltage control logic with relatively lower operating voltage (such as 5V or 12V). A thermal oxidation procedure is performed at a temperature between about 750 to 850° C. in an oxygen ambient, resulting in the growth of a protective silicon dioxide layer 101 on the substrate 100.

Figure 2:
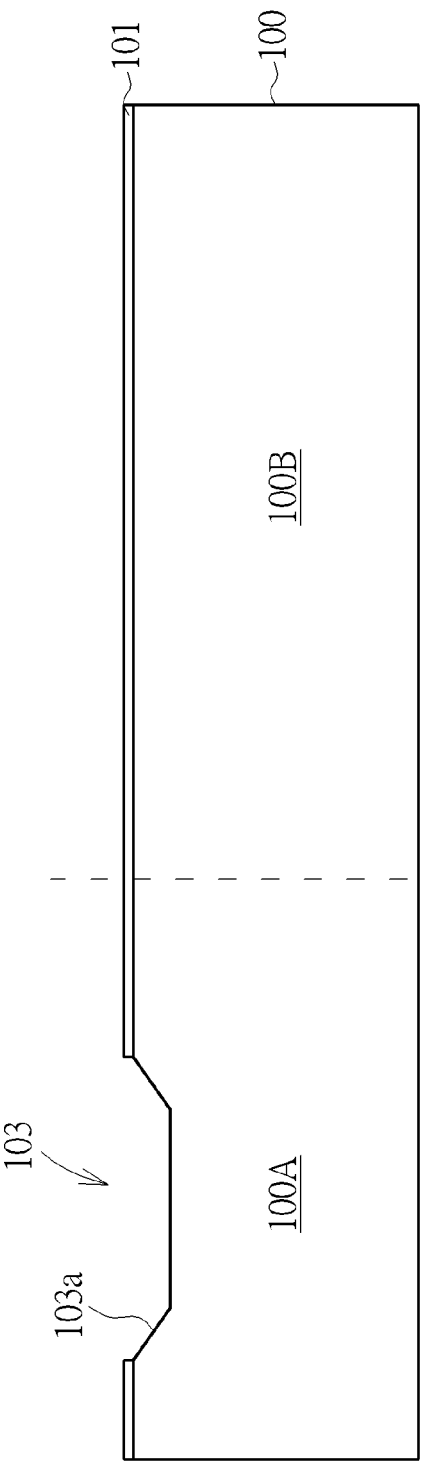

Please refer to FIG. 2. After the silicon dioxide layer 101 is formed, a zero etch process is performed to form alignment marks (not shown) and preliminary trenches 103 in the substrate 100. The alignment marks are marks for the reticle to align with in the photolithographic process. The preliminary trench 103 is a shallow, tapered trench with a gradual slope of sidewall. In the present invention, the preliminary trench 103 is formed together with alignment marks in the zero etch process with patterned photoresist. This means the preliminary trench 103 is general provided with a depth the same as the alignment marks. This also means the depth of the preliminary trench 103 can be easily adjusted depending on the product requirement by changing the etch time of zero etch without affecting the standard and routine logic process. Furthermore, in the present invention, the preliminary trench 103 is a predefined structure for the final trench. Since the preliminary trench 103 is predetermined in advance, it is possible in the present invention to form a final trench structure with more gradual sidewall 103a and better corner rounding profile.

Please refer to FIG. 3. After the preliminary trench 103 is formed, an implantation process is performed to form a buried layer 100C in the logic region 100B of the substrate 100. In the present invention, the buried layer 100C may be all kinds of well structures necessary in the active region, such as P-type well (PW), N-type well (NW), or a common buried N-type well (BNW). The buried layer 100C can be formed only in the logic region 100B via the shielding of a photoresist on the high-voltage region 100A. It should be noted that, in certain embodiments, the implantation process and the buried layer maybe omitted depending on the process and product characteristics.

Please refer to FIG. 4. After the buried layer 100C is formed, a spacer 105 is formed on the sidewall 103a of the preliminary trench 103. In the preferred embodiment, the spacer 105 on the sidewall of the preliminary trench 103 serves as a buffer structure in following STI (shallow trench isolation) etch process. The presence of the spacer 105 in the process can make the desired final STI trench have more gradual sidewalls compared to those STI trench form in standard STI process, especially to form a sidewall profile with different slopes. The spacer 105 may be formed by first depositing a conformal silicon oxide layer, and then perform a blanket etch to reduce the thickness of the silicon oxide layer until only the spacer 105 on the sidewall of preliminary trench 103 remains. The blanket etch process would also remove the protective silicon dioxide layer 101 previously formed on the substrate 100.

It should be noted that, in certain embodiments, the spacer 105 may not be formed in the process . If the desired final STI structure needs not to have a sidewall of different slopes, the spacer 105 would be unnecessary and may be omitted. In addition, the spacer 105 may be formed of any suitable insulating material other than silicon oxide.

Figure 5:
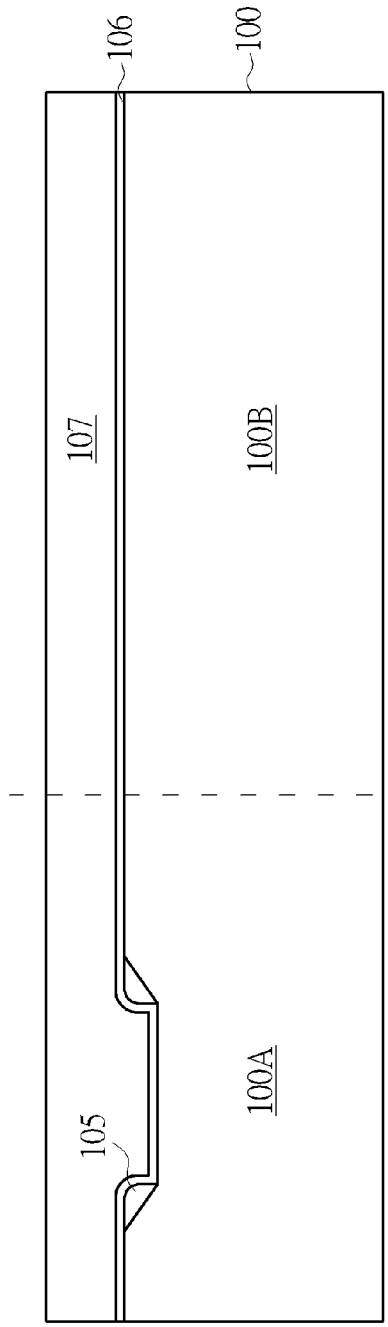

Please refer to FIG. 5. After the spacer 105 is formed on the sidewall, a pad oxide layer 106 and a silicon nitride layer 107 are sequentially formed on the substrate 100. The pad oxide layer 106 would conformally cover the spacer 105 and the preliminary trench 103. In the embodiment, the pad oxide layer 106 is formed to reduce the stress of substrate surface, and the silicon nitride layer 107 will serve as an etch mask in following STI process.

Figure 6:
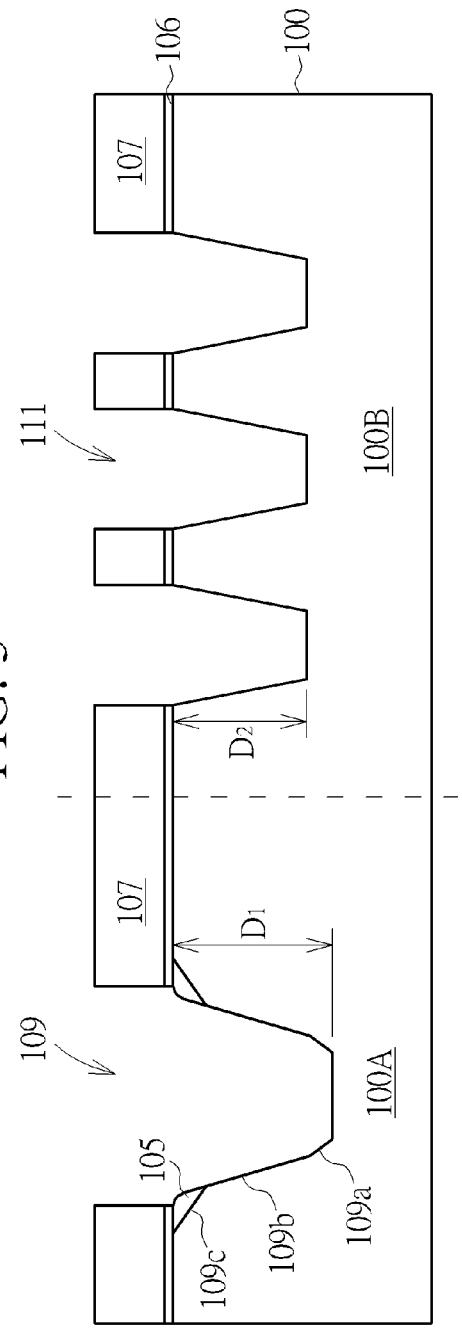

Please refer to FIG. 6. After the pad oxide layer 106 and the silicon nitride layer 107 are formed, the silicon nitride layer 107 is patterned by a photolithographic process to define the pattern of the STIs both in the HV region 100A and the logic region 100B. A STI etch process is then performed using the patterned silicon nitride layer 107 to form the shallow trench in the substrate. In the present invention, the STI etch process is a standard process of logic STI loop to form shallow trench 111 in the logic region 100B. However, please note that this STI etch would also etch the preliminary trench 103 again in the HV region 100A. It is clearly shown in the FIG. 6 that a deeper final trench 109 with a depth of $D_1$ and a number of normal STI trench 111 with a depth of $D_2$ are formed respectively in the HV region 100A and the logic region 100B. Since the final trench 109 is subject to two etch steps, i.e. the zero etch (the first etch) and the STI etch (the second etch), the final trench 109 would be slightly deeper and more gradual than the normal STI trench 111. This also means that the depth of the final trench 109 is tunable by predetermining the depth of zero mark with the depth of normal STI.

Moreover, in the process that the spacer 105 is used, the profile of the spacer 105 would be transferred to the final trench 109 by the STI etch process. It can be seen in FIG. 6 that the final trench 109 has a lower portion 109a with slope gradient near the bottom of the final trench 109. Generally, if the STI etch is performed in presence of the spacer 105, the final trench 109 would have two or more different slopes. For example, as the final trench 109 shown in FIG. 6, the sidewall of the final trench 109 includes a lower portion 109a with slope gradient near the bottom, a middle steep portion 109b, and a upper portion 109c from the sidewall 103a of previous preliminary trench 103, and the slope of the steep portion 109b of the sidewall would be larger than the slope of the lower portion with slope gradient 109a of the sidewall.

Please refer now to FIG. 7. After the final trench 109 and the STI trench 111 are formed, a high-density plasma (HDP) deposition process is performed to fill up the trench with insulating material, and the substrate with deposited insulating material is then planarized by a chemical mechanical polishing process to remove the unnecessary portion above the silicon nitride layer 107, thereby forming the STIs 113 and 115 in both the HV region 100A and the logic region 100B. It should be noted that, since the final trench 109 in the HV region 100A and the normal STI trench 111 in the logic region 100B have different profiles, the resulting STIs 113 and 115 would accordingly have different profiles. Generally, STI 113 has sidewalls with profiles more gradual than that of the STI 115, and the corner 113a of the STI 113 in the HV region 100A would have better rounding effect. Thus the unwanted high electric field resulted from the sharp corner in the HV region can be properly prevented.

Finally, please refer to FIG. 8. After the STIs 113 and 115 are formed, a STI etch-back process is performed to remove the unnecessary silicon nitride layer 107. It should be noted that the height of the STI structure would be slightly reduced by this etch-back process. Furthermore, in the presence of the spacer 105, the final STI 113 in the HV region 100A would be provided with a spacer portion 105 on the upper portion 109c of the sidewall near the surface of the substrate 100. In the condition that the pad oxide layer 106, the spacer 105 and the STI 113 are all made of silicon oxide, the three portions would emerge together. Alternately, the material of spacer 105 may be other insulating material other than oxide, then the STI 113 and the adjacent spacer portion 105 would have different materials. In this way, the STI process of the present invention is completed. After the STIs 113 and 115 are formed and the active area (AA) between the STIs are defined, the process of manufacturing the MOS devices can be subsequently conducted to complete the whole semiconductor process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A shallow trench isolation in a substrate, comprising:
    a substrate;
    a shallow trench isolation formed in said substrate, wherein the sidewall of said shallow trench isolation has two different slopes; and
    spacer portions formed in said substrate on the upper portion of said sidewall and lower than the top surface of said shallow trench isolation.

2. The shallow trench isolation in a substrate of claim 1, wherein the sidewall of said shallow trench isolation comprises an upper portion, a middle steep portion and a lower portion, and the slope of said middle steep portion is larger than the slope of said lower portion.

3. The shallow trench isolation in a substrate of claim 1, wherein said shallow trench isolation is formed in the high-voltage region of said substrate.

4. The shallow trench isolation in a substrate of claim 3, wherein said high-voltage region is high-voltage double diffused metal-oxide semiconductor (HV-DMOS) region.

5. The shallow trench isolation in a substrate of claim 3, further comprising normal STIs formed in the region other than said high-voltage region in said substrate.

6. The shallow trench isolation in a substrate of claim 5, wherein said shallow trench isolation in said high-voltage region is deeper and has a more gradual sidewall than said normal STIs in other regions.

* * * * *